United States Patent [19]

Choi et al.

[11] Patent Number: 5,751,734
[45] Date of Patent: May 12, 1998

[54] DECODING METHOD AND APPARATUS USING TRACE DELETION FOR VITERBI ALGORITHM

[75] Inventors: Hyung-Jin Choi; Sung-Bae Cho; Suk-Jin Jung; Hyung-Kil Lee, all of Suwon, Rep. of Korea

[73] Assignee: Samsung Electronics Co., Ltd., Kyungki-Do, Rep. of Korea

[21] Appl. No.: 742,663

[22] Filed: Nov. 4, 1996

[51] Int. Cl.$^6$ ............................................. G06F 11/10
[52] U.S. Cl. ............................................. 371/43.4; 371/43.7
[58] Field of Search ............................................. 371/43, 44, 45, 371/46, 43.4, 43.7, 43.1; 375/341, 262

[56] References Cited

U.S. PATENT DOCUMENTS

| | | | |
|---|---|---|---|
| 4,823,346 | 4/1989 | Kobayashi et al. | 371/43 |
| 5,291,524 | 3/1994 | Itakura et al. | 371/43 |
| 5,390,198 | 2/1995 | Higgins | 371/43 |
| 5,398,254 | 3/1995 | Miya et al. | 371/43 |
| 5,446,746 | 8/1995 | Park | 371/43 |
| 5,581,581 | 12/1996 | Sato | 375/341 |

*Primary Examiner*—Robert W. Beausoliel, Jr.
*Assistant Examiner*—Trinh L. Tu
*Attorney, Agent, or Firm*—Sughrue, Mion, Zinn, Macpeak & Seas, PLLC

[57] ABSTRACT

A decoding apparatus for decoding input data using a Viterbi algorithm includes a first unit for repetitively performing determination of a survivor path corresponding to each state at each time unit based on the input data and a Trellis diagram, and for generating decision vectors and path number information whenever a branch path is determined. A second unit is provided for storing the decision vectors generated in the first unit and for outputting path information representing each survivor path determined by the stored decision vectors. A third unit stores the path number information output from the first unit and the path information output from the second unit, and deletes the branch path information corresponding to the path number information of the first unit from the stored path information, while retracing the previous states during the time when the branch path to be deleted does not overlap the other survivor path having a branch path connected to the next state. The third unit generates decoded data corresponding to input data based on the finally remaining survivor path.

5 Claims, 3 Drawing Sheets

DECODING METHOD AND APPARATUS USING TRACE DELETION FOR VITERBI ALGORITHM

BACKGROUND OF THE INVENTION

The present invention relates to a decoding system based on a Viterbi algorithm, and more particularly, to a decoding method and apparatus in which branch paths in a Trellis diagram are deleted from previous states connected to states having no connection to the next state, to obtain an optimum survivor path for decoding data.

Generally, in a digital communication system, a signal transmitted from a transmitter is altered due to noise imposed on a channel, and then the altered signal is received by a receiver. Thus, the digital communication system uses an error correcting code in order to reduce an error generated in the signal.

A trellis coded modulation (TCM) signal obtained by a convolutional coding and modulation technique, which is an error correcting coding technique, is decoded by a decoder implemented by a demodulator and a Viterbi algorithm. The Viterbi algorithm effectively performs maximum likelihood sequence estimation and detects the TCM signal as well. The Viterbi algorithm is also used in detection of a convolutional code. As such, the Viterbi algorithm can be extensively used. The Viterbi algorithm basically performs maximum likelihood decoding and uses a Trellis diagram to greatly reduce the amount of necessary calculation. The Viterbi algorithm compares the similarity between paths input to respective states of the Trellis diagram and an input signal, to have only a single survivor path exist in a single state. This process is repeatedly performed in each stage of the Trellis diagram. A conventional Viterbi decoding apparatus using a trace back method will be described below with reference to FIGS. 1 and 2.

In FIG. 1, a branch metric generator (BMG) unit 11 calculates branch metrics according to a state transition, from a state at a particular time unit to the state of the next time unit, on a Trellis diagram as shown in FIG. 2 with respect to input data. In FIG. 2, $t_1, t_2, \ldots, t_n$ indicated on the horizontal axis represent time units, respectively, and "00," "10," "01" and "11" indicated in the vertical axis represent states, respectively. The Trellis diagram illustrated in FIG. 2 is a four-state Trellis diagram. Therefore, the states corresponding to a particular time unit have a branch which can shift to states of the next time unit, respectively. The number of the branches is determined by the Trellis diagram. The BMG unit 11 calculates a branch metric corresponding to the branches which can shift to a state at a particular time unit. An add-compare-select (ACS) unit 12 receiving the branch metrics applied from the BMG unit 11 determines a survivor path having an optimum metric with respect to each state at the current time unit, and outputs a decision vector representing a branch metric to be added to the survivor path to a survivor memory unit 13. More particularly, the ACS unit 12 adds the branch metrics of the branches entering each state at the current time unit and state metrics corresponding to the survivor paths connected to the branches at the previous time unit. The ACS unit 12 then compares the path metrics obtained by the sums of the branch metrics and the state metrics, thereby selecting a partial path corresponding to an optimum partial path metric as a survivor path with respect to a corresponding state at a current time unit.

A state metric is a sum of branch metrics of the branch paths constituting a survivor path at the previous time unit. For clarity, a "branch" is defined as a path which can shift to states at the next time unit from the state at a current time unit, and a "branch path" is a path contained in the survivor path between the neighboring time units.

The case of a binary symmetric channel will be discussed as an example. In a binary symmetric channel, a survivor path becomes a path having the minimum partial path metric, in which survivor paths individually corresponding to all the states at a current time unit is selected. Among the partial paths to the left of the node, the one with the smallest partial path metric is preferred and is called the survivor path. Since the metric is well known in connection with the Viterbi algorithm, the detailed description thereof will be omitted. If a survivor path corresponding to the particular state at the current time unit is determined, the ACS unit 12 outputs a decision vector representing a branch path which is newly added to the survivor path, to the survivor memory unit 13.

The survivor memory unit 13, storing decision vectors output from the ACS unit 12, traces back the finally existing survivor path based on the decision vectors, when the input decision vectors correspond to a decoding depth, and finally determines the transmitted data through a trace back process, to output information corresponding to the determined data as decoded information.

However, the above-described conventional decoding apparatus uses decision vectors corresponding to a decoding depth, thereby using a trace back method for tracing back a finally existing survivor path. Thus, if an error is generated at the time of determining a finally existing survivor path, the finally existing survivor path and the data transmitted via the incorrect survivor path are incorrect. This is due to the fact that a trace back method for determining the finally transmitted data is blocked in a decoding depth, which functions as additional loss except for the limitation of decoding depth when implementing an ideal Viterbi algorithm.

SUMMARY OF THE INVENTION

To solve the above-described problem, it is an object of the present invention to provide a decoding method which can remove the deficiency due to the block noted above, by deleting branch paths entering the states having no connection to the next state.

It is another object of the present invention to provide a decoding apparatus implementing the above-described method by which branch paths entering the states having no connection to the next state are deleted.

To accomplish the above object of the present invention, there is provided a decoding method for decoding input data using a Viterbi algorithm, the decoding method comprising the steps of:

(a) repeatedly performing determination of a survivor path corresponding to each state at each time unit based on the input data and the Trellis diagram;

(b) detecting a survivor path which does not have a branch path connected to a state in the next time unit among the survivor paths determined in step (a);

(c) repeating deletion of the branch path in the survivor path detected in step (b) while retracing the previous states during the time when the branch path to be deleted does not overlap the other survivor path having a branch path connected to the next state; and (d) generating decoded data corresponding to input data based on the finally remaining survivor path in step (c).

A further object of the present invention is to provide a decoding apparatus for decoding input data using a Viterbi algorithm and a Trellis diagram, the decoding apparatus comprising:

first means for repeatedly performing determination of a branch path corresponding to each state at each time unit based on the input data and the trellis diagram, and for generating decision vectors and path number information whenever a branch path is determined;

second means for storing the decision vectors generated in the first means and for outputting path information representing each survivor path determined by the stored decision vectors; and third means for storing the path number information output from the first means and the path information output from the second means, and for repeating deletion of the branch path information corresponding to the path number information of the first means from the stored path information, while retracing the previous states during the time when the branch path to be deleted does not overlap the other survivor path having a branch path connected to the next state, and for generating decoded data corresponding to input data based on the finally remaining survivor path.

BRIEF DESCRIPTION OF THE DRAWINGS

The above objects of the present invention will become more apparent by describing in detail preferred embodiments thereof with reference to the attached drawings in which.

DETAILED DESCRIPTION OF PREFERRED EMBODIMENTS

An embodiment of the present invention will be described below in more detail with reference to the accompanying drawings.

The trace deletion method according to the present invention includes the steps of (1) determining a survivor path corresponding to each state of each time unit according to a Viterbi algorithm, (2) detecting a survivor path which does not have a branch path connected to a state in the next time unit among the determined survivor paths, and (3) repeating deletion of the branch path in the detected survivor path while retracing the previous states during the time when the branch path to be deleted does not overlap the other survivor path having a branch path connected to the next state.

Figure 1:
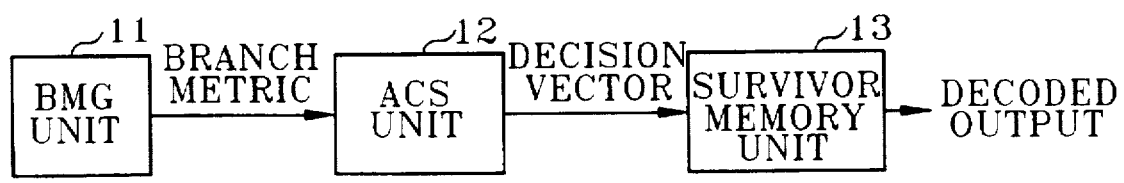
FIG. 1 is a block diagram of a conventional decoding apparatus using a trace back method in a Viterbi algorithm.
Figure 3:
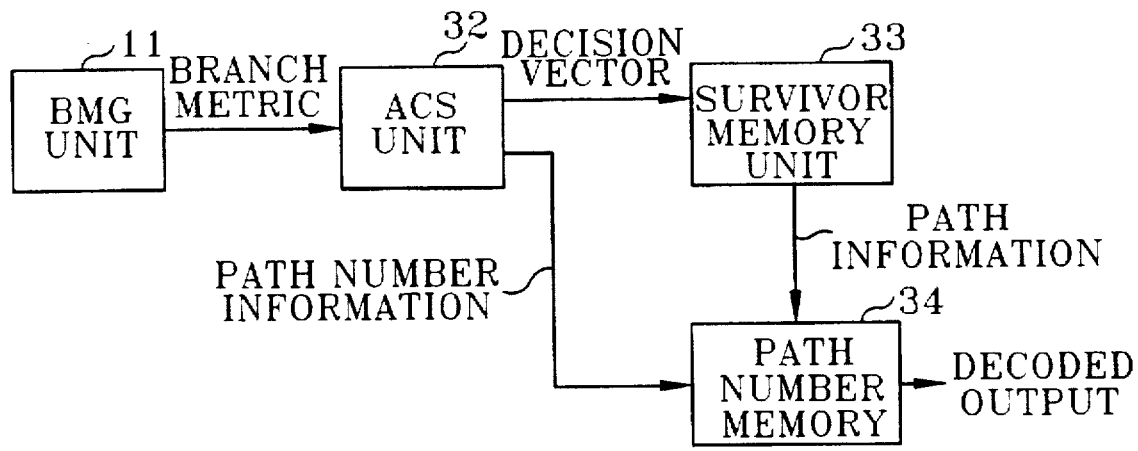
FIG. 3 is a block diagram of a decoding apparatus using a trace deletion method according to a preferred embodiment of the present invention.

Referring to FIG. 3, a BMG unit 11 performs the same operation as that described with reference to FIG. 1, at each time unit of the Trellis diagram with respect to input data, and outputs the resultant branch metrics. An ACS unit 32 stores state metrics involving survivor paths individually corresponding to each state at a previous time unit. In the ACS unit 32, the branch metrics involving the branches at the n-th time unit which can shift to each state of the (n+1)-th time unit are added to a corresponding state metric, respectively, and the resultant path metrics are compared with each other, to then generate a select signal for selecting a branch path having an optimum path metric with respect to each state at the (n+1)-th time unit. The ACS unit 32 produces a decision vector representing a selected branch path for each state, and outputs the produced decision vector to a survivor memory unit 33. The ACS unit 32 also uses a select signal used in selecting the branch path which is newly added in the survivor path at the (n+1)-th time unit, and thus generates path number information representing the number of the branch paths connected to the states at the (n+1)-th time unit from each state at the n-th time unit. The generated path number information is supplied to a path number memory unit 34 which stores the path number information. The survivor memory unit 33 stores the decision vectors supplied from the ACS unit 32 and generates path information representing the survivor paths based on the stored decision vectors. The generated path information is supplied to the path number memory unit 34.

Figure 4:
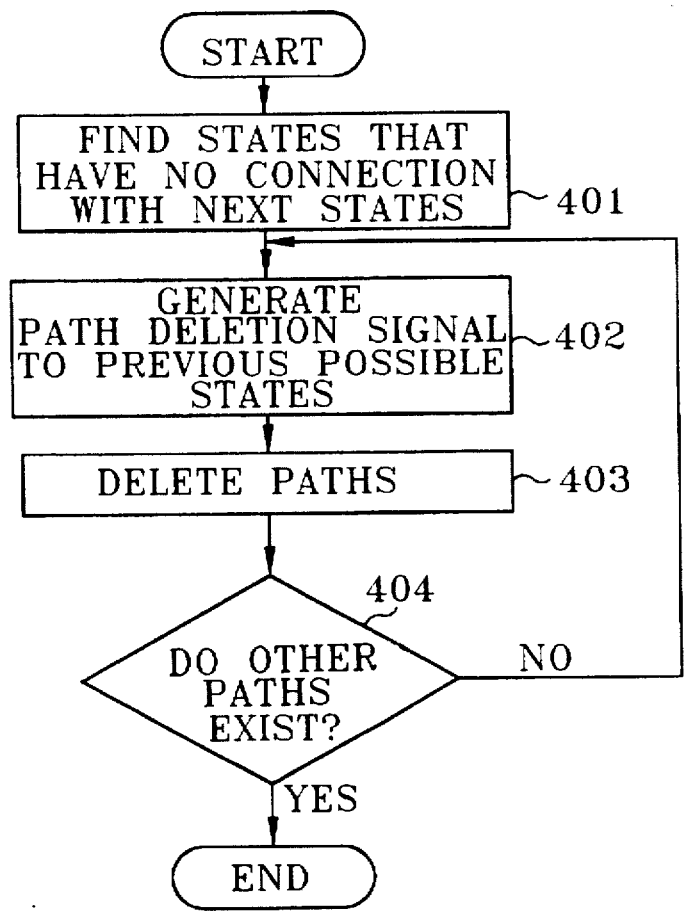
FIG. 4 is a flow chart diagram for explaining a trace deletion process in the FIG. 3 apparatus.

The path number memory unit 34 uses the stored path number information and the path information supplied from the survivor memory unit 33, to thereby perform a trace deletion method according to the present invention. The operation of the path number memory unit 34 will be described below with reference to FIGS. 2 and 4.

The path number memory unit 34 detects states at the n-th time unit which are not connected to the states at the (n+1)-th time unit in the survivor path based on the path number information (step 401). The path number memory unit 34 generates a path deletion signal for deleting information representing the branch path at the (n−1)-th time unit which is connected to the detected state or states at the n-th time unit (step 402), and deletes the information of the corresponding branch path from the path information according to the path deletion signal (step 403). In step 404, the path number memory unit 34 judges whether a branch path is connected from the (n−1)-th time unit to the node in the (n−1)-th time unit from which the branch path to the n-th time unit has been deleted exists, based on the path number information corresponding to the state at the (n−1)-th time unit from which the branch path information has been deleted. If it is judged that a branch path does not exist, the path number memory unit 34 generates a path deletion signal for deleting the information representing a branch path at the (n−2)-th time unit which is connected to a state or states at the (n−1)-th time unit (step 402), and deletes the information about the corresponding branch path from the path information according to the path deletion signal (step 403). On the contrary, if it is judged that a branch path exists, the path number memory unit 34 stops the path deletion operation.

Figure 2:
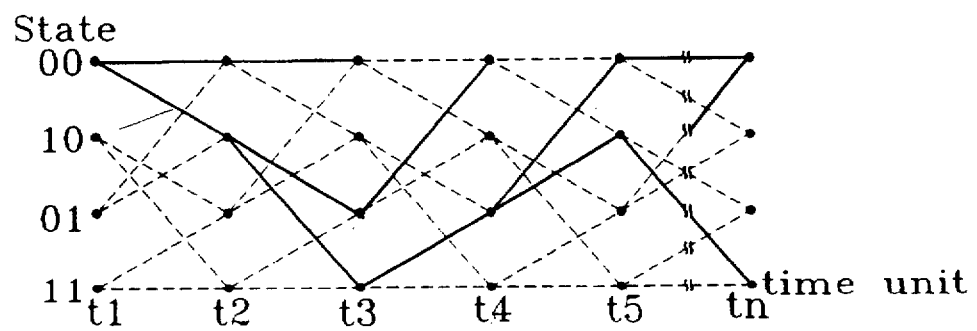
FIG. 2 illustrates a Trellis diagram for explaining a decoding operation of the data decoded in the FIG. 1 apparatus.

To assist understanding of the invention, an example where the survivor paths which are finally determined in each of the time units, which are shown in FIG. 2, will be described below.

The path number memory unit 34 detects that the state of "00" does not have any branch path connected to the next time unit t5 with respect to the time unit t4 in step 401. The path number memory unit 34 performs steps 402 and 403, to thereby decrease, by one, the path number information value corresponding to a state of "01" at the previous time unit t3 and delete the path information corresponding to the branch path connected to the state of "00" from the state of "01" at the time unit t3. By repeating the path deletion operation, the path information corresponding to the branch path, connected to the state of "01" at the time unit t3 from the state of "10" at the time unit t2, is deleted. Thereafter, since a branch path connected from the state of "10" at the time unit t2 to another state of "11" at the time unit t3 exists, the path number memory unit 34 stops the path deletion operation. As another example, assuming that a state of "10" at the time unit t5 in FIG. 2 has no branch path connected to the next time unit t6, the branch path from the state of "10" at the time unit t5 to the state of "01" at the time unit t4 are deleted by the path number memory unit 34.

The path number memory unit 34 determines the finally remaining survivor path with respect to a decoding depth through the above-described process. Therefore, if the path number memory unit 34 is designed to output the decoded data corresponding to the finally remaining survivor path, the decoded data corresponding to the transmitted data can be obtained.

Figure 5:
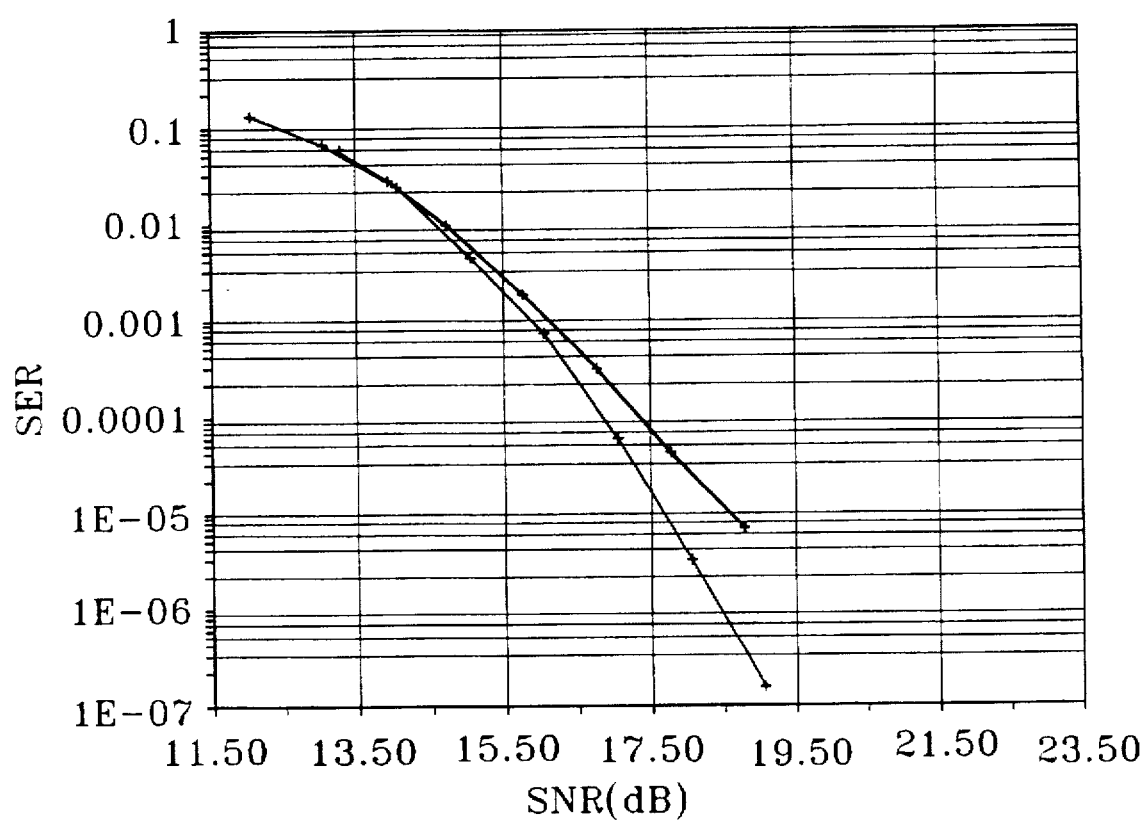
FIG. 5 is a graph for comparing performance between the conventional trace back method and the trace deletion method according to the present invention.

FIG. 5 shows a comparison result between the trace deletion method proposed in the present invention and the conventional trace back method with respect to a four-state convolutional code. In FIG. 5, the thinner solid line indicates the result of the method proposed in the present invention, and the thicker solid line indicates the conventional method. From FIG. 5, it can be seen that the proposed method in the present invention has a higher gain of about 1.2 dB in a symbol error rate $10^{-5}$ than that of the conventional method.

As described above, the embodiment of the path number memory unit 34 for updating the stored path information based on deletion of the branch path having no connection to the state at the next time unit has been described. However, the present invention is not limited in storage of the updated path information. It will be apparent to one skilled in the art that a modification updating the path information stored in the survivor memory unit 33, is possible within the technical scope of the present invention.

Further, the above-described trace deletion method is performed whenever a state which is not connected to the state at the next time unit is found, or may be performed intermittently or whenever a state which is not connected to the state at the next time unit from a predetermined time unit. Therefore, determination of the time unit when a trace deletion method is performed does not limit the present invention.

As described above, the decoding method and apparatus using a trace deletion method in the Viterbi algorithm, enhance decoding performance compared with the conventional method determining the decoded data through a trace back method by a decoding depth.

While only certain embodiments of the invention have been specifically described herein, it will apparent that numerous modifications may be made thereto without departing from the spirit and scope of the invention.

What is claimed is:

1. A decoding method for decoding input data using a Viterbi algorithm and a trellis diagram having a plurality of states, said decoding method comprising the steps of:

(a) determining, for each state of said trellis diagram at each time unit, a survivor path based on said input data;

(b) detecting at least one survivor path, among survivor paths determined in step (a), which does not have a branch path connected to a state in a next time unit in said trellis diagram;

(c) retracing said at least one survivor path detected in step (b);

(d) deleting each branch path of said at least one survivor path which does not overlap another survivor path having a branch path connected to a state in a next time unit of said trellis diagram; and (e) generating decoded data corresponding to said input data based on a final remaining survivor path determined in said step (d).

2. The decoding method according to claim 1, wherein step (b) comprises the steps of:

(b1) detecting states at an n-th time unit in said trellis diagram having no branch path connected to a state at an (n+1)-th time unit, based on said survivor paths determined in step (a); and (b2) generating path number information representing a number of branch paths connected to said states at said n-th time unit detected in step (b1) from each state at an (n-1)-th time unit.

3. The decoding method according to claim 2, wherein step (d) comprises the steps of:

(d1) deleting branch paths, connected to said states at said n-th time unit detected in step (b1) from said states at said (n-1)-th time unit, based on said path number information;

(d2) judging whether a branch path extending to said (n-1)-th time unit from a state at an (n-2) time unit exists;

(d3) repeating step (d1) for time units retraced from said (n-2) time unit when said branch path does not exist; and (d4) terminating branch path deletion when said branch path is present.

4. A decoding apparatus for decoding input data using a Viterbi algorithm and a trellis diagram, said decoding apparatus comprising:

first means for determining, for each state of said trellis diagram at each time unit, a survivor path based on said input data, and for generating decision vectors and path number information when said survivor path is determined, said path number information respectively corresponding to survivor paths which are connected to a state in a next time unit;

second means for storing said decision vectors and for outputting path information representing each survivor path; and third means for storing said path number information output from said first means and said path information output from said second means, and for deleting path information, from said path information stored in said second means, corresponding to said path number information from said first means when said path number information does not correspond to a branch path which overlaps another survivor path having a branch path connected to another state of said trellis diagram, and for generating decoded data corresponding to said input data based on a final remaining survivor path.

5. The decoding apparatus according to claim 4, wherein said path number information represents the number of branch paths, connected from a state at an (n-1)-th time unit to states at an n-th time unit, which do not have a branch path connected to a state at an (n+1)-th time unit.

* * * * *